United States Patent
Kim

(10) Patent No.: US 11,152,409 B2
(45) Date of Patent: Oct. 19, 2021

(54) DISPLAY PANEL FOR PROCESSING BIOMETRICS USING TFT PHOTODETECTORS INTEGRATED THEREON

(71) Applicant: Hoon Kim, La Habra, CA (US)

(72) Inventor: Hoon Kim, La Habra, CA (US)

(*) Notice: Subject to any disclaimer, the term of this patent is extended or adjusted under 35 U.S.C. 154(b) by 0 days.

(21) Appl. No.: 16/823,977

(22) Filed: Mar. 19, 2020

(65) Prior Publication Data

US 2021/0056279 A1 Feb. 25, 2021

Related U.S. Application Data

(60) Provisional application No. 62/889,560, filed on Aug. 20, 2019.

(51) Int. Cl.

| | |
|---|---|
| *H01L 27/146* | (2006.01) |
| *G02F 1/1333* | (2006.01) |
| *G02F 1/13357* | (2006.01) |
| *G06K 9/00* | (2006.01) |
| *H01L 27/32* | (2006.01) |
| *H01L 31/036* | (2006.01) |
| *H01L 31/113* | (2006.01) |
| *G06F 3/041* | (2006.01) |
| *G06F 3/042* | (2006.01) |
| *G02F 1/133* | (2006.01) |

(52) U.S. Cl.
CPC ...... *H01L 27/1461* (2013.01); *G02F 1/13338* (2013.01); *G02F 1/133606* (2013.01); *G06F 3/0421* (2013.01); *G06F 3/04182* (2019.05); *G06F 3/041662* (2019.05); *G06K 9/0004* (2013.01); *H01L 27/14612* (2013.01); *H01L 27/14616* (2013.01); *H01L 27/14689* (2013.01); *H01L 27/323* (2013.01); *H01L 31/036* (2013.01); *H01L 31/1136* (2013.01); *G02F 1/13318* (2013.01); *H01L 27/3227* (2013.01); *H01L 27/3234* (2013.01)

(58) Field of Classification Search
CPC . G06K 9/0004; H01L 27/323; H01L 27/3234; G02F 1/133606; G02F 1/13338
See application file for complete search history.

(56) References Cited

U.S. PATENT DOCUMENTS

| | | | |
|---|---|---|---|
| 2007/0229452 A1 | 10/2007 | Sano et al. | |
| 2016/0128653 A1 | 5/2016 | Fortuna et al. | |
| 2017/0337413 A1* | 11/2017 | Bhat | G06K 9/00087 |
| 2018/0032778 A1 | 2/2018 | Lang | |
| 2018/0069127 A1* | 3/2018 | Yang | H01L 29/66969 |
| 2020/0373338 A1* | 11/2020 | Okhonin | H01L 27/14605 |
| 2020/0395421 A1 | 12/2020 | He et al. | |
| 2020/0401269 A1 | 12/2020 | Reynolds | |

* cited by examiner

*Primary Examiner* — Alexander Eisen
*Assistant Examiner* — Kebede T Teshome
(74) *Attorney, Agent, or Firm* — Nelson Mullins Riley & Scarborough LLP; Kongsik Kim, Esq.

(57) ABSTRACT

A display panel includes a display pixel configured to irradiate light, an image sensor pixel included together with the display pixel in one unit pixel, including a thin film transistor (TFT) photodetector including an active layer formed of amorphous silicon or polycrystalline silicon on an amorphous transparent material, and configured to collect light reflected from a body located on the transparent material, and a processor configured to process biometrics along with positioning of the body according to the light reflected from the body.

16 Claims, 14 Drawing Sheets

DISPLAY PANEL FOR PROCESSING BIOMETRICS USING TFT PHOTODETECTORS INTEGRATED THEREON

CROSS-REFERENCE TO RELATED APPLICATION

This application claims priority to U.S. Provisional Application No. 62/889,560 filed on Aug. 20, 2019, which application is incorporated herein by reference in its entirety.

TECHNICAL FIELD

The present disclosure relates to a display panel which processes biometrics through thin film transistor (TFT) photodetectors integrated thereon.

BACKGROUND

Technologies such as liquid crystals, organic light emitting diode (OLED) cells, touch screens, backlights, and thin film transistors (TFTs) on glass are integrated on a display panel. Particularly, the trend of recent mobile devices is toward a display panel which tends to be as large as or larger than an overall device size, and a display itself is becoming more flexible.

However, the current display system performs only a one-way function of outputting an image or the like to the outside, without a function of efficiently, directly acquiring an input signal. At present, the display system executes only a touch screen function, while a separate image sensor performs a process such as image sensing.

Particularly in a mobile device or a laptop computer to which a biometric recognition and authentication system such as fingerprint or face recognition and authentication is essential, there are technological limitations in acquiring a signal from an image sensor confined to any specific position on a display. Although it is most desirable to incorporate an input signal device into the display system, an image sensor cannot be implemented on a display panel with the current technology, thus making it impossible to integrate the display panel with the image sensor in real implementation.

The above information is presented as background information only to assist with an understanding of the disclosure. No determination has been made, and no assertion is made, as to whether any of the above might be applicable as prior art with regard to the disclosure.

SUMMARY

An aspect of the disclosure is to address at least the above-mentioned problems and/or disadvantages and to provide at least the advantages described below.

Accordingly, an aspect of the disclosure is to provide a high-sensitivity image sensor on a glass substrate or a flexible substrate such as a polyimide film, which is used as a display panel, by a thin film transistor (TFT) fabrication technology.

Another aspect of the disclosure is to process biometrics fast and accurately, using a display panel having display pixels and image sensor pixels integrated thereon.

Another aspect of the disclosure is to enable a display module to function as an image sensor without the need for a separate image sensor on the display panel.

Another aspect of the disclosure is to perform an image sensing process without the need for separately providing a light emitter for an image sensor, by using a light emitting device or backlight unit (BLU) of a display as a light source for the image sensor.

Another aspect of the disclosure is to implement a transparent display panel capable of displaying and image sensing by vertically stacking a screen panel of a display and an image sensing panel or arranging the screen panel and the image sensing panel on the same panel.

Another aspect of the disclosure is to fabricate a switching TFT for display and a driving TFT for image sensing in a single process by arranging a screen panel and an image sensing panel on the same panel.

Another aspect of the disclosure is to use a light source for a display also as a light source for an image sensor.

Another aspect of the disclosure is to use both of a BLU of a liquid crystal display (LCD) and a light emitting source of an organic light emitting diode (OLED).

Additional aspects will be set forth in part in the description which follows and, in part, will be apparent from the description, or may be learned by practice of the presented embodiments of the disclosure.

According to an embodiment of the disclosure, a display panel includes a display pixel configured to irradiate light, an image sensor pixel included together with the display pixel in one unit pixel, including a TFT photodetector including an active layer formed of amorphous silicon or polycrystalline silicon on an amorphous transparent material, and configured to collect light reflected from a body located on the transparent material, and a processor configured to process biometrics along with positioning of the body according to the light reflected from the body.

According to an embodiment of the disclosure, the display panel may further include an infrared (IR) light source configured to cause diffused reflection on the transparent material by irradiating IR light from one side of the transparent material, the image sensor pixel may collect the IR light diffusedly reflected from the body contacting the transparent material, and the processor may process the biometrics along with the positioning of the body by the light generated from the IR light source and then collected.

According to an embodiment of the disclosure, the display panel may further include a backlight light source configured to irradiate backlight in a transmission direction of the transparent material through a space between adjacent TFT photodetectors, the image sensor pixel may collect the backlight passed through the transparent material and then reflected back from the body, and the processor may process the biometrics along with the positioning of the body by the light generated from the backlight light source and then collected.

According to an embodiment of the disclosure, the processor may process the biometrics along with the positioning of the body by light generated from the backlight light source and then reflected from the body contacting the transparent material.

According to an embodiment of the disclosure, the processor may process the biometrics along with the positioning of the body by light generated from the backlight light source and then reflected from the body which does not contact the transparent material.

According to an embodiment of the disclosure, the processor may process the biometrics by identifying information about at least one of a vein, a fingerprint, or a face based on the light reflected from the body and comparing the identified information with pre-stored information.

According to an embodiment of the disclosure, the transparent material may be formed into a concave lens pattern or a convex lens pattern at a position of the unit pixel.

According to an embodiment of the disclosure, the unit pixel may include the TFT photodetector including the active layer formed of amorphous silicon or polycrystalline silicon on an amorphous transparent substrate, and at least one transistor electrically coupled to the TFT photodetector and configured to generate a voltage output from photocurrent generated in the active layer.

According to an embodiment of the disclosure, the TFT photodetector may be formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

According to an embodiment of the disclosure, the active layer may include a material having a conductive property controllable by tunneling or an electric field.

According to an embodiment of the disclosure, the active layer may include at least one of amorphous silicon or polycrystalline silicon.

According to an embodiment of the disclosure, the TFT photodetector may include an amorphous transparent substrate including the transparent material, a source formed of amorphous silicon or polycrystalline silicon on the transparent substrate, a drain formed of amorphous silicon or polycrystalline silicon, opposite to the source on the transparent substrate, the active layer formed between the source and the drain and including a current channel formed between the source and the drain, an insulating oxide film formed on the source, the drain, and the active layer, and a light receiver formed on the insulating oxide film, configured to absorb light, and insulated from the active layer by the insulating oxide film.

According to an embodiment of the disclosure, in the TFT photodetector, when light is incident on the light receiver, electrons may migrate by tunneling through the insulating oxide film between the light receiver and the active layer excited with the insulating oxide film in between, the electron migration may change an amount of charge in the light receiver, the changed amount of charge may change a threshold voltage of the current channel, and thus photocurrent may flow in the current channel.

According to an embodiment of the disclosure, the TFT photodetector may use light generated from the display panel as a light source for the image sensor pixel.

According to an embodiment of the disclosure, a display panel includes a display pixel configured to irradiate light, an image sensor pixel stacked with the display pixel, included together with the display pixel in one unit pixel, including a TFT photodetector including an active layer formed of amorphous silicon or polycrystalline silicon on an amorphous transparent material, and configured to collect light reflected from a body located on the transparent material, and a processor configured to process biometrics along with positioning of the body according to the light reflected from the body.

According to an embodiment of the disclosure, the image sensor cell may be formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

According to an embodiment of the disclosure, a display panel includes a display pixel configured to irradiate light, an image sensor pixel formed together with the display pixel on the same layer, included together with the display pixel in one unit pixel, including a TFT photodetector including an active layer formed of amorphous silicon or polycrystalline silicon on an amorphous transparent material, and configured to collect light reflected from a body located on the transparent material, and a processor configured to process biometrics along with positioning of the body according to the light reflected from the body. The image sensor cell is formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The disclosure will be described in detail with reference to the attached drawings. Lest it should obscure the subject matter of the disclosure, a known technology will not be described in detail. An ordinal number (e.g., first, second, and so on) used in the description of the disclosure is used simply to distinguish one component from another component.

When it is said that one component is "coupled to or with" or "connected to" another component, it is to be understood that the one component may be coupled to or connected to the other component directly or with a third party in between.

Figure 1:
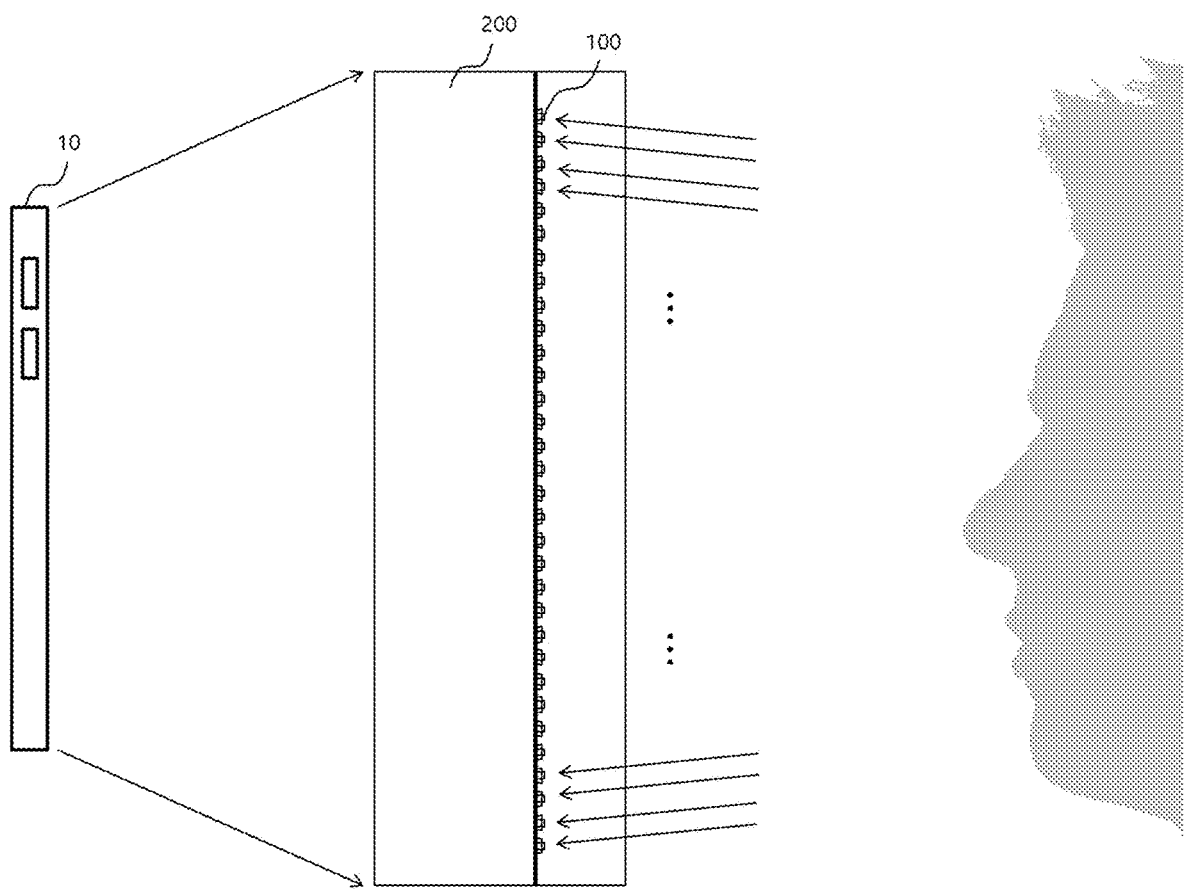
FIG. 1 is a schematic diagram illustrating a display module used as an image sensor in an electronic device with thin film transistor (TFT) photodetectors implemented thereon on a display panel according to an embodiment of the disclosure.

FIG. 1 is a schematic diagram illustrating a display module used as an image sensor in an electronic device with thin film transistor (TFT) photodetectors implemented on a display panel according to an embodiment of the disclosure.

A TFT photodetector 100 according to the disclosure is formed on a display panel 200 in an electronic device 10. The electronic device 10 may be any device equipped with a display, such as a smartphone, a laptop computer, a monitor, or a TV.

Specifically, TFT photodetectors 100 may be formed across the whole or part of the display panel 200, and a TFT photodetector 100 may be formed in each individual pixel, thus operating as a part of the pixel. When TFT photodetectors 100 are formed across the whole display panel 200, the number of the TFT photodetectors 100 may be equal to the number of pixels corresponding to the resolution of the display panel 200. The display panel 200 may be any of a light receiving display requiring a backlight unit (BLU), such as a liquid crystal display (LCD) or a light emitting display which emits light on its own, such as a light emitting diode (LED) (e.g., organic LED (OLED) or active matrix OLED (AMOLED)) display or a plasma display panel (PDP).

The display panel 200 displays a video or an image or operates as an image sensor, according to an operation of the electronic device 10. When the display panel 200 operates as an image sensor, an optical image of an external object may be acquired by means of a plurality of TFT photodetectors 100 implemented on the display panel 200. A light source required for image sensing may be an external light source such as natural light or an external lighting, or an internal light source such as a BLU or OLED elements of the display panel 200.

As such, formation of TFT photodetectors 100 according to the disclosure on the display panel 200 advantageously enables use of the display panel 200 as an image sensor without the need for providing a separate image sensor in the electronic device 10. Further, because the display panel 200 is used as an image sensor, a light source for display may also be used as a light source for image sensing without the need for adding a light source for image sensing in the electronic device 10. Therefore, the effects of device simplification and reduced fabrication cost may be expected.

Further, because the pixels of the image sensor are formed in the same size as the pixels of the display, as many image sensor pixels as the number of pixels corresponding to the resolution of the display may be arranged in the electronic device 10. In this case, the whole display may serve as an image sensor. The electronic device 10 may acquire an image of an external object by controlling image sensor pixels in the whole or part of the display. Hereinbelow, the term "image sensor pixel" is interchangeably used with "unit pixel of the image sensor". Obviously, a TFT photodetector 100 of the disclosure is formed in a unit pixel of the image sensor. Further, the term "unit pixel of the display panel" is interchangeably used with "display pixel". A unit pixel will be described in detail with reference to FIG. 9.

Further, the electronic device 10 may acquire biometric information about an external object, such as information about a fingerprint, the vein of a finger, a face, or an iris, by the display panel 200 with the TFT photodetectors 100 implemented thereon. For example, a user may enable acquisition of a fingerprint image through a plurality of image sensor pixels formed on an area of the display by touching the area with a finger or placing a finger within a predetermined distance to the area in the electronic device 10. Throughout the specification, the display panel 200 may also be referred to as the display or a screen panel of the display.

Now, a description will be given of implementation of TFT photodetectors on a display panel.

Figure 2:
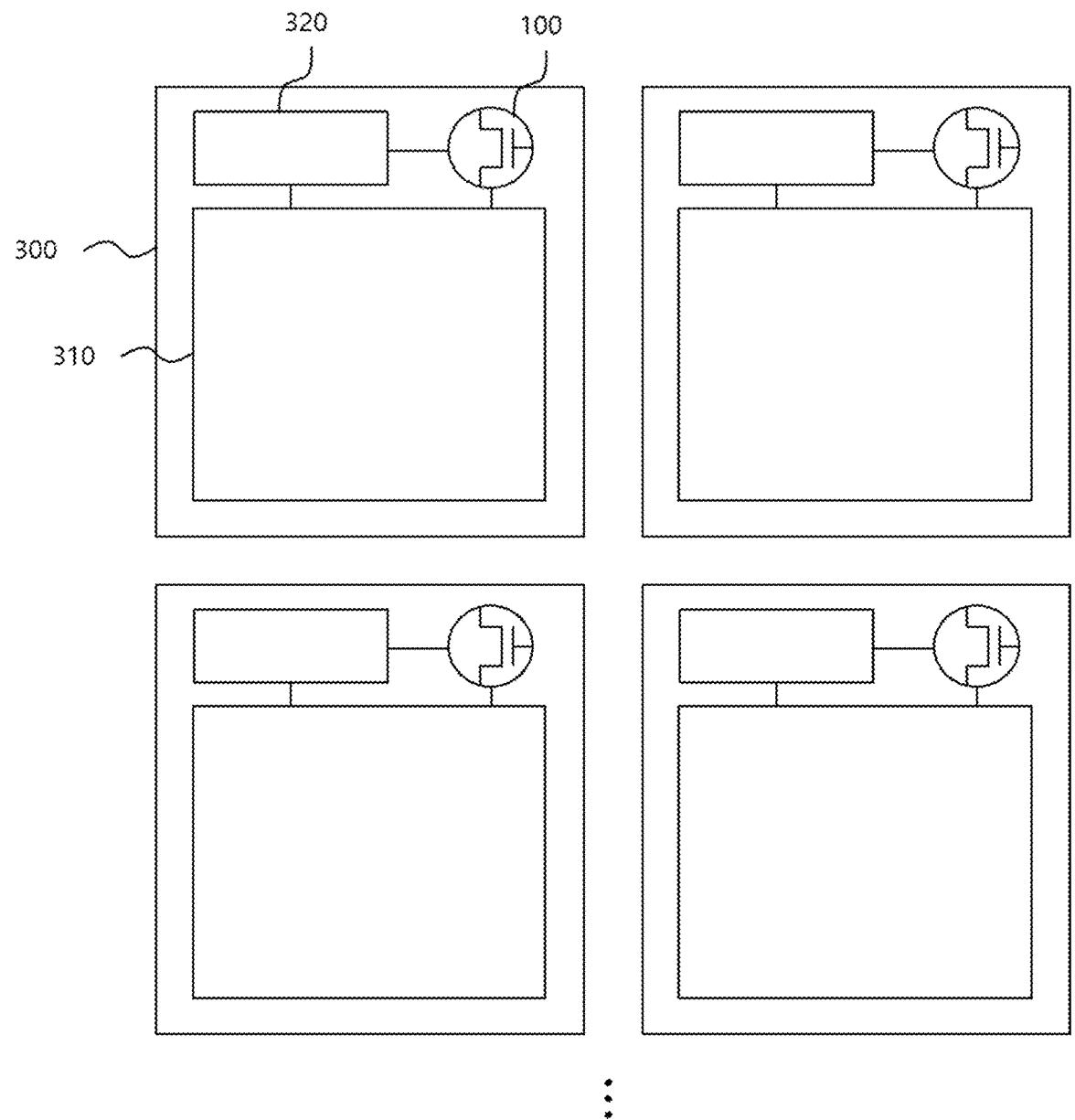
FIG. 2 is a diagram illustrating an exemplary TFT photodetector implemented on a pixel basis according to an embodiment of the disclosure.

FIG. 2 is a diagram illustrating exemplary implementation of a TFT photodetector in each pixel of a display according to an embodiment of the disclosure.

Although the TFT photodetector 100 operates in a similar principle to that of a photo assisted tunneling-photodetector (PAT-PD) disclosed in U.S. patent application Ser. No. 15/885,757, the TFT photodetector 100 and the PAT-PD are different in that the PAT-PD is formed on a single crystalline silicon substrate, and an active layer, a source, a drain, and a gate serving as a light receiver are formed of single crystalline silicon, whereas the TFT photodetector 100 of the disclosure is formed on the display panel 200 which is a glass substrate or a transparent flexible substrate using a transparent film formed of, for example, polyimide (PI), polyethylene terephthalate (PET), polypropylene (PP), polycarbonate (PC), polymethylmethacrylate (PMMA), polyethylenenaphthalate (PET), polyetheretherketone (PEEK), polyethersulfone (PES), or polyarylite, and an active layer, a source, a drain, and a light receiver are formed of amorphous silicon (a-Si) or polycrystalline silicon (poly-Si or P—Si). Glass or a PI film is amorphous, which makes it impossible to stack single crystalline silicon thereon. Therefore, when TFT photodetectors are formed on a glass substrate or a flexible substrate, the TFT photodetectors should be amorphous or polycrystalline. Under circumstances, the amorphous silicon or the polycrystalline silicon may be replaced with a material with a conductive property controllable by an electric field or tunneling. Throughout the specification, the term "PAT-PD" or "TFT PAT-PD" is interchangeably used with "TFT photodetector".

Preferably, display pixels and image sensor pixels are matched to each other in a one-to-one correspondence. FIG. 2 illustrates an exemplary pixel structure on the display panel 200 with TFT photodetectors 100 implemented thereon. A unit pixel 300 of the display panel 200 includes a light emitting area 310 for display, a driving switch 320, and a TFT photodetector 100 for image sensing. The display panel 200 may be designed such that each unit pixel of the display panel and each unit pixel of the image sensor occupy areas of similar sizes and thus the display pixels and the image sensor pixels are matched in a one-to-one correspondence per position. In this case, as the TFT photodetector 100 may operate using the light emitting area 310 of the display pixel as a light source, a signal may be processed by matching the light emitting area 310 to the TFT photodetector 100, and data may be processed by matching data included in the light source to data collected by the TFT photodetector 100.

Although it is preferable to form the TFT photodetector 100 without any overlap with the light emitting area 310, the TFT photodetector 100 may be formed overlapping with the light emitting area 310 over a predetermined area because the TFT photodetector 100 occupies a small area relative to the light emitting area 310. However, to maximize a photoelectric conversion effect, the introduction of unnecessary light is blocked by shielding an area except for the light receiver of the TFT photodetector 100 with a metal or the like. The resulting shielding of a part of the light emitting area 310 with the light shielding area except for the light receiver of the TFT photodetector 100 may decrease the light emission efficiency of the display.

In some cases, the display pixels and the image sensor pixels may be configured in different sizes. For example, when the unit pixels of the image sensor are designed such that one display pixel area corresponds to n image sensor pixels, n TFT photodetectors 100 share the light emitting area of one display pixel as a light source, making it difficult to control the TFT photodetectors 100 individually by light source control. However, the light source control may be simplified, which in turn simplifies an image sensing process. On the contrary, the unit pixels of the image sensor may be designed such that the area of one unit pixel of the image sensor corresponds to m display pixels. In this case, although fewer image sensor pixels than the number of pixels corresponding to the resolution of the display may be arranged, one TFT photodetector 100 uses the light emitting areas of m display pixels as a light source, and thus fine light source control and data processing required for image sensing may become difficult.

The light emitting area 310 may be formed in a different structure according to the type of a used display. For example, when the display panel 200 of the electronic device 10 is a light emitting display such as an OLED display, the light emitting area 310 may be a light emitting pixel with red, green, blue (RGB) sub-pixels arranged therein. When the display panel 200 of the electronic device 10 is a light receiving display such as an LCD, RGB sub-filters may be arranged in the light emitting area 310. Obviously, the TFT photodetector 100 may use an external light source such as natural light as a light source for image sensing, instead of the light emitting area 310.

With reference made to FIG. 2 again, a plurality of unit pixels 300 are arranged in a lattice structure on the display panel 200. Each unit pixel 300 may be formed by vertically stacking or arranging side by side a display sub-panel formed on a glass substrate or a transparent flexible substrate and an image sensor sub-panel formed on a glass substrate or a transparent flexible substrate. In this regard, FIGS. 3A and 3B illustrate the cross sections of unit pixels 300 on the display.

Figure 3A:
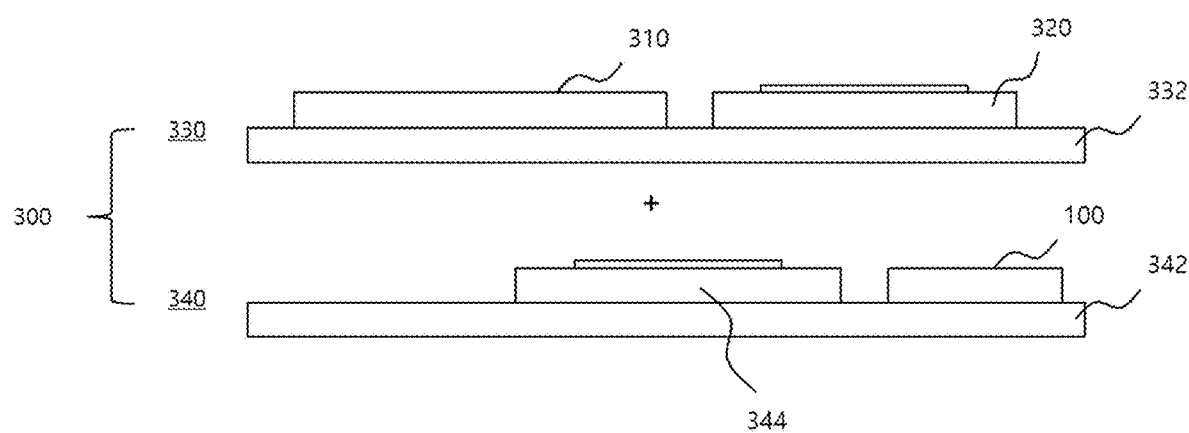
FIGS. 3A and 3B are sectional views illustrating exemplary implementations of a TFT photodetector on a pixel basis on a display according to an embodiment of the disclosure.
Figure 3B:
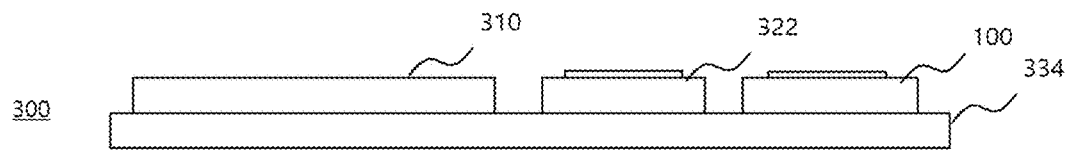

Referring to FIGS. 3A and 3B, the unit pixel 300 of the display panel includes a display sub-panel 330 and an image sensor sub-panel 340. The display sub-panel 330 may include a light emitting area 310 for display and its driving switch 320, and the image sensor sub-panel 340 may include a TFT photodetector 100 for image sensing and a detector driving TFT 344 for driving the TFT photodetector 100.

For example, the detector driving TFT 344 may include at least one transistor which is electrically coupled to a source side of the TFT photodetector 100 and generates a voltage output from photocurrent generated in the active layer of the TFT photodetector 100.

The display sub-panel 330 or the image sensor sub-panel 340 is formed on a transparent glass substrate or a transparent flexible substrate such as a PI film (hereinafter, also referred to as a glass substrate or a transparent substrate). The transparent display panel 200 may be formed by vertically stacking and attaching the two panels as illustrated in FIG. 3A or arranging the two panels side by side on the same glass substrate 334 as illustrated in FIG. 3B.

Particularly, the image sensor sub-panel 340 may be stacked with the display sub-panel 330 in the structure of FIG. 3A. Further, in response to light sensed by the image sensor sub-panel 340, a voltage output may be generated from photocurrent generated from the active layer.

When light is incident on the image sensor sub-panel 340, electrons are introduced into an N-type gate by tunneling from a P-type active layer to an oxide film, among charges of two PN areas excited with the oxide film in between. The electron migration changes the threshold voltage of a current channel between a source and a drain in correspondence with a change in the total amount of charge in the gate, and thus photocurrent proportional to the intensity of the incident light flows in the active layer. Further, the image sensor sub-panel 340 may generate a voltage output from the flowing photocurrent.

Alternatively, the light emitting area 310 and the driving switch 320 of an OLED device for display, and the TFT photodetector 100 for image sensing and the detector driving TFT 344 may be arranged together on the same glass substrate 332 or 342, as illustrated in FIG. 3B. In this case, a driving switch 322 may be formed by incorporating a switching TFT for controlling the light emitting area 310 with a switching TFT for controlling the TFT photodetector 100, or driving switches may be formed separately.

Throughout the specification, the display sub-panel 330 and the image sensor sub-panel 340 may also be referred to as a display pixel and an image sensor pixel, respectively.

As described before, the image sensor pixel 340 of a similar size to that of the display pixel 330 senses light and acquires an image by signal processing and detector driving, and includes the TFT photodetector 100 and the detector driving TFT 344 for driving the TFT photodetector 100. The driving switch 320 for an output to be used for display, and the detector driving TFT 344 for driving the TFT photodetector 100 formed on an image sensor pixel basis may be integrated or configured separately. In this manner, the TFT photodetector 100 of the disclosure is formed on a pixel basis.

Because the TFT photodetector 100 should be formed on an amorphous substrate such as a glass substrate or a PI film, not a single crystalline silicon substrate, the TFT photodetector 100 should be implemented in a different manner from an existing photodetector using single crystalline silicon. Now, a description will be given of a detailed structure, operation mechanism, fabrication method of a TFT photodetector according to the disclosure.

Figure 4:
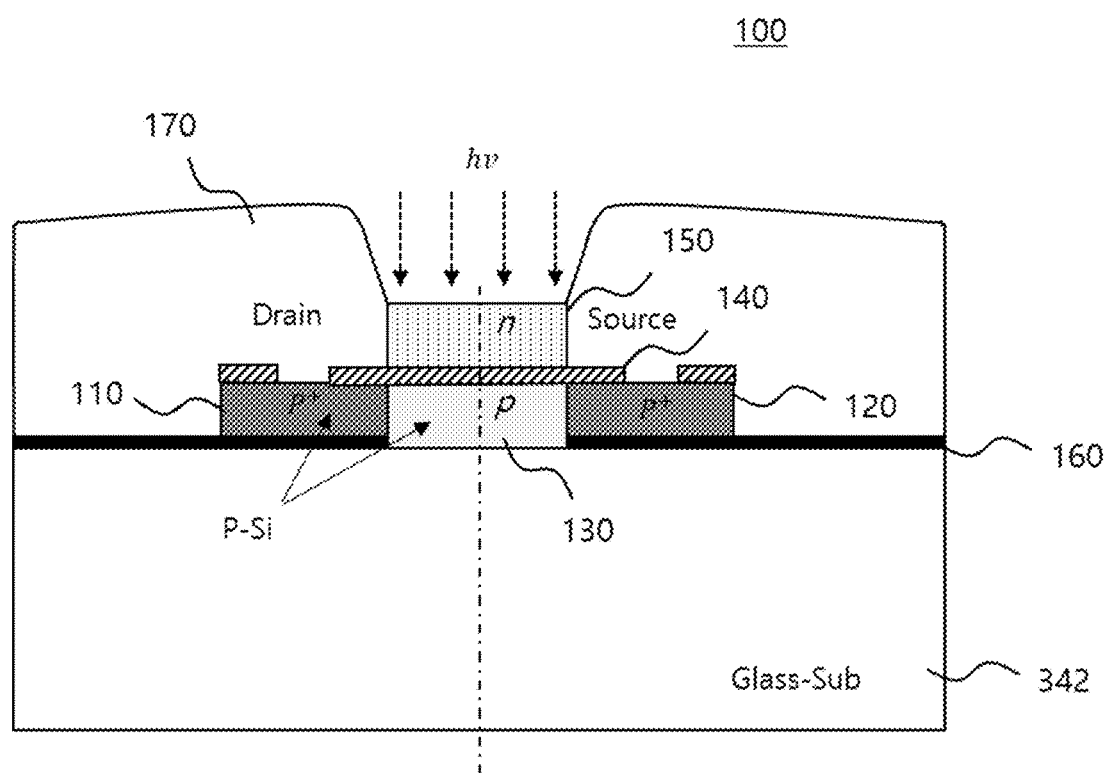
FIG. 4 is a sectional view illustrating a TFT photodetector according to an embodiment of the disclosure.

FIG. 4 is a sectional view illustrating a TFT photodetector according to an embodiment of the disclosure.

Referring to FIG. 4, the TFT photodetector 100 of the disclosure is formed on the transparent substrate 342 such as an amorphous glass substrate or a flexible substrate, and includes, on the transparent substrate 342, a gate 150 formed of a-Si or poly-Si, an insulating oxide film 140 capable of controlling tunneling of optically excited charges, a drain 110, a source 120, and an active layer 130 in which a current channel is formed between the source 120 and the drain 110. While the drain 110, the source 120, the active layer 130, and the gate 150 are formed of a-Si or poly-Si, they may be formed of any other material as far as the material has a conductive property controllable by tunneling or an electric field.

The gate 150 is formed of N-type poly-Si or a-Si by implanting an N-type impurity and operates as a light receiver that absorbs incident light. The active layer 130 is formed of P-type poly-Si or a-Si, with the insulating oxide film 140 between the active layer 130 and the gate 150. The active layer 130 forms a current channel according to optical excitation between the drain 110 and the source 120 which are P+-type diffusion layers.

An area on which light is incident is confined to the gate 150 serving as the light receiver and the active layer 130 with the insulating oxide film 140 interposed between the active layer 130 and the gate 150. For this purpose, a metal protection layer 160 may be formed on a boundary surface of the transparent substrate 342, except for the area between the transparent substrate 342 and the active layer 130, to shield unnecessary light introduced into the TFT photodetector 100. A metal shielding layer 170 may be formed in the remaining area except for the gate 150 in an upper part of the TFT photodetector 100. The shielding layer 170 may be formed by a silicide and metal process. The TFT photodetector 100 limits an area on which light is incident to the gate 150 serving as the light receiver by means of the shielding layer 170, thereby maximizing the photoelectric conversion in the gate 150. Hereinbelow, the gate 150 and the light receiver are interchangeably used throughout the specification.

With no light introduced, the TFT photodetector 100 controls biases of the gate 150, the drain 110, the source 120, and the active layer 130 to maintain a stable equilibrium state in which electrons are trapped. For this purpose, the overlying shielding layer 170 and the metal protection layer 160 on the boundary surface of the transparent substrate 342 are provided to shield unintended unnecessary light through the transparent substrate 342 of, for example, glass. Specifically, the active layer 130 between the source 120 and the drain 110 is bias-controlled to have a threshold voltage at which the potential state of a silicon surface on which a current channel may be formed is shortly before a subthreshold state during an initial fabrication process. In this state, when light is not incident on the gate 150 as the light receiver, photocurrent does not flow in the current channel.

When light is incident on the light receiver, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiver causes a change in the conductance of the current channel, and thus photocurrent corresponding to the changed conductance flows.

Since the gate 150 is doped with holes, the electrons passed through the insulating oxide film 140 by tunneling are combined with holes in an area of the gate 150 near to the insulating oxide film 140, thereby generating a depletion layer at the top end of the insulating oxide film 140. Therefore, the threshold voltage drops due to a change in the charge of the active layer 130 near to the insulating oxide film 140, thereby exciting the current channel between the source 120 and the drain 110.

In other words, current that flows in the current channel excited between the source 120 and the drain 110 by light reception at the light receiver is not a direct flow of charges of electron-hole pairs (EHPs) caused by the light reception but an indirect current flow in the current channel excited by tunneling of directly generated charges. Therefore, a very high-efficiency light detection capability may be achieved.

FIGS. 5A-5D are sectional views illustrating a process of fabricating a TFT photodetector according to an embodiment of the disclosure.

Figure 5A:
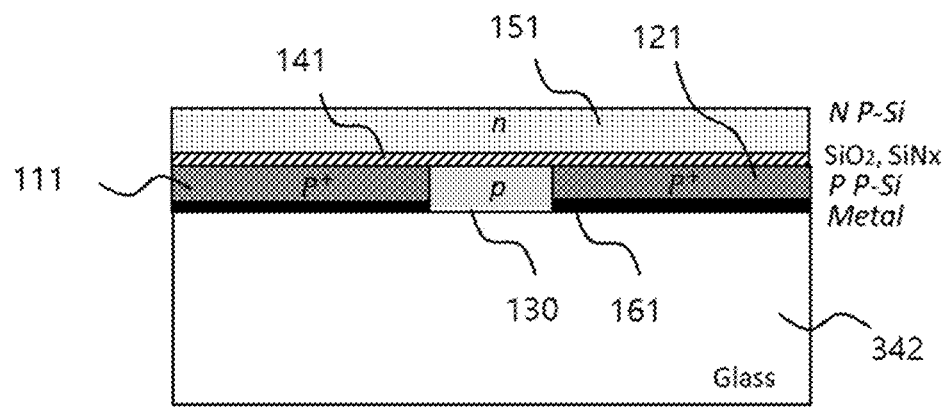
FIGS. 5A-5D are sectional views illustrating a process of fabricating a TFT photodetector according to an embodiment of the disclosure.

In FIG. 5A, the P-type poly-Si or a-Si diffusion layer 130 to be used as an active layer is formed on the glass substrate 342 or a flexible substrate of, for example, a PI film, and two P+-type diffusion layers 111 and 121 are formed of a-Si or poly-Si at both sides of the diffusion layer 130.

The diffusion layers 130, 111, and 121 may be formed of a-Si or poly-Si. To increase mobility, the diffusion layers 130, 111, and 121 may be formed by depositing a-Si and then crystalizing the deposited a-Si into poly crystals by thermal treatment such as laser annealing, or directly depositing poly-Si on the transparent substrate.

Subsequently, a thin $SiO_2$ or SiNx insulating oxide film 141 is formed on the diffusion layers 130, 111, and 121. The insulating oxide film 141 may be formed by sputtering or plasma enhanced chemical vapor deposition (PECVD).

Subsequently, an N-type diffusion layer 151 is formed of poly-SI or a-Si on the insulating oxide film 141 in the same manner.

Figure 5B:
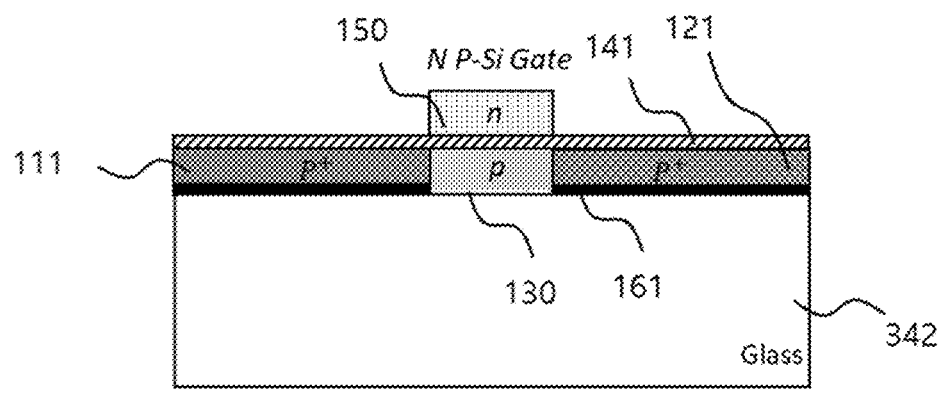
Figure 5C:
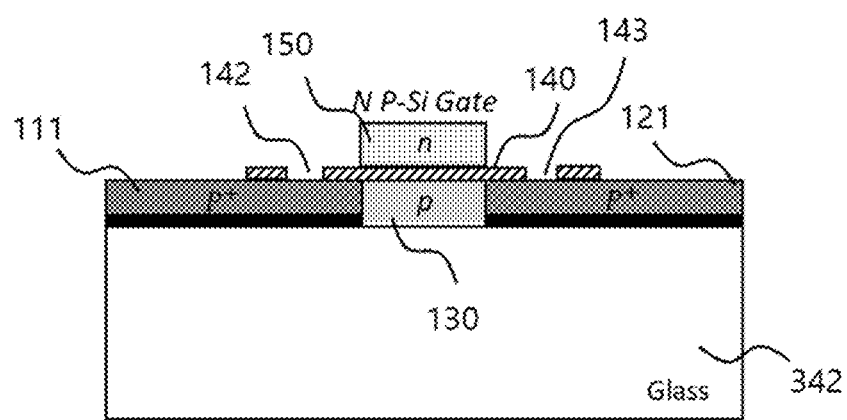

Referring to FIG. 5B, the gate 150 is then formed for use as a light receiver by photo-patterning the generated diffusion layer 151. Referring to FIG. 5C, the generated insulating oxide layer 141 is etched away, remaining only a necessary part by a photoresist (PR) patterning process. Partial insulating oxide films 142 and 143 are removed together on areas of the diffusion layer 121, which are to be used as the source 120 and the drain 110, so that a source electrode and a drain electrode may be connected.

Figure 5D:
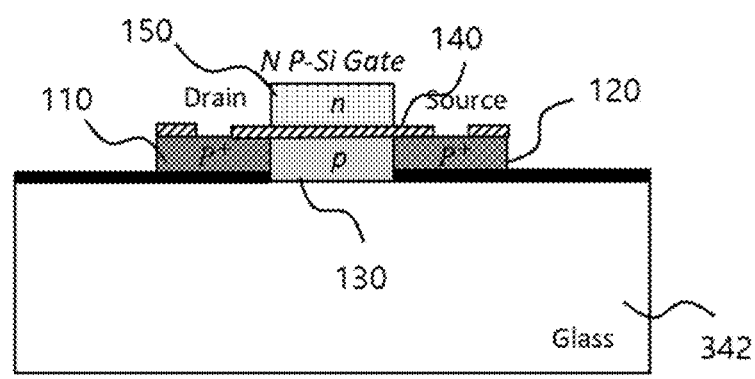

Referring to FIG. 5D, the remaining area except for the areas to be used as the source 120 and the drain 110 is then removed from the P+-type diffusion layers 111 and 121 by etching. Electrodes are formed by depositing a metal or the like in the areas of the insulating oxide films 142 and 143 which have been removed in the source 120 and the drain 110.

In the TFT photodetector 100 fabricated in the above manner, current flows through a current channel excited between the source 120 and the drain 110 by tunneling, as described before. If the thickness of the active layer 130 is equal to or larger than a predetermined thickness, for example, 100 nm, a neutral area is produced separately in an area under the gate 150, which has not been depleted perfectly, aside from the current channel generated by light. Unnecessary extra charges generated by light may be accumulated in the neutral area, and are likely to act as a changing factor to the threshold voltage which linearly changes by light. Therefore, the neutral area needs separate processing.

Figure 6:
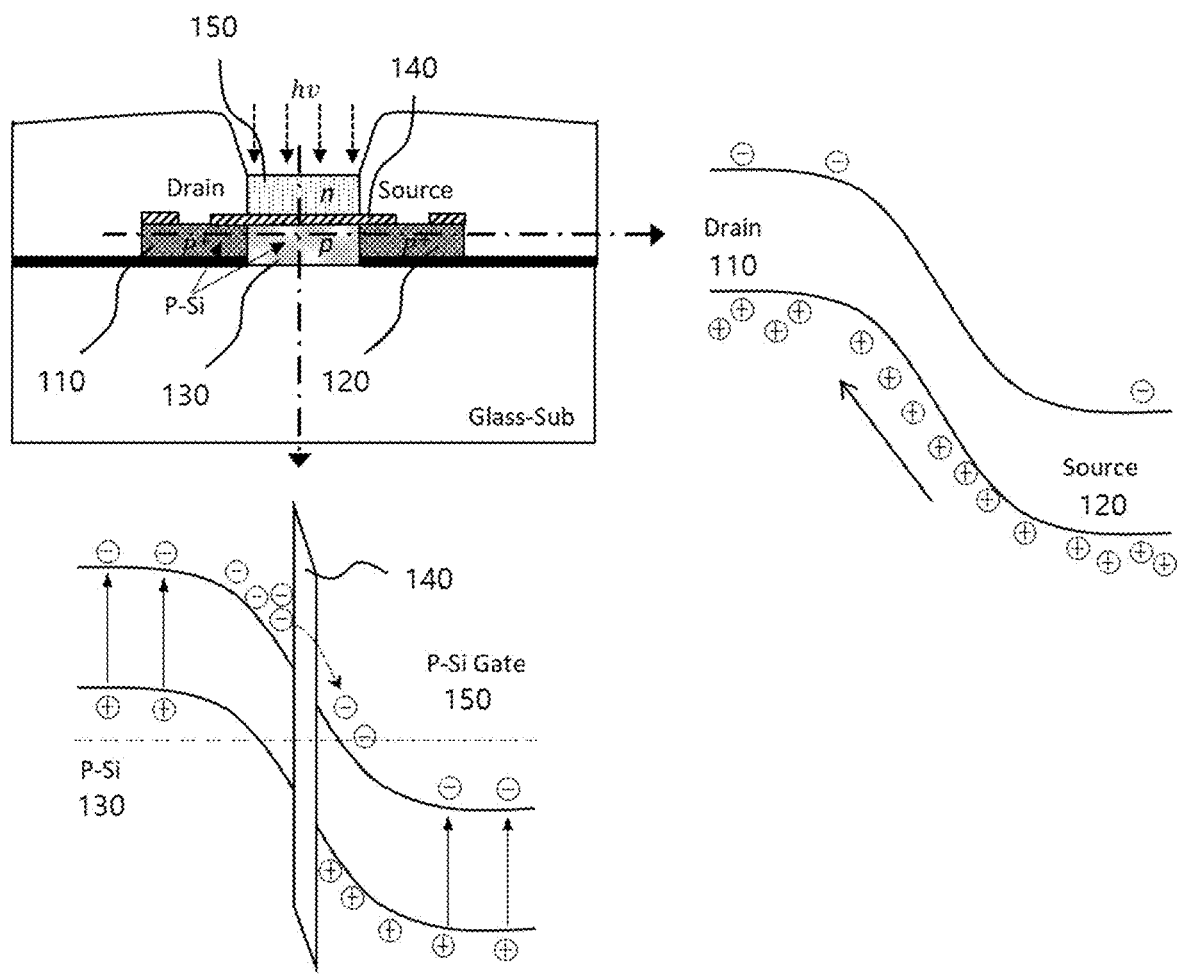
FIG. 6 is an energy band diagram illustrating a photoelectric conversion mechanism of a TFT photodetector according to an embodiment of the disclosure.

FIG. 6 is an energy band diagram referred to for describing a photoelectric conversion mechanism of a TFT photodetector according to an embodiment of the disclosure.

When light is incident on the gate 150 as the light receiver, EHPs are generated in the gate 150 and the active layer 130. Excited electrons of the active layer 130 tunnels through the insulating oxide film 140 by an electric field, thereby depleting a bottom end portion of the gate 150. As a result, the total charge amount of the gate 150 is changed, which leads to a threshold voltage modulation effect equivalent to application of a negative power source to the gate 150. Accordingly, a current channel is formed in the active layer 130 of poly-Si, and thus current flows between the source 120 and the drain 110. The TFT photodetector 100 implemented based on this structure and principle has a high-sensitivity detection capability of sensing even a single photon and enables very intense photocurrent to flow even with a small amount of light.

Figure 7:
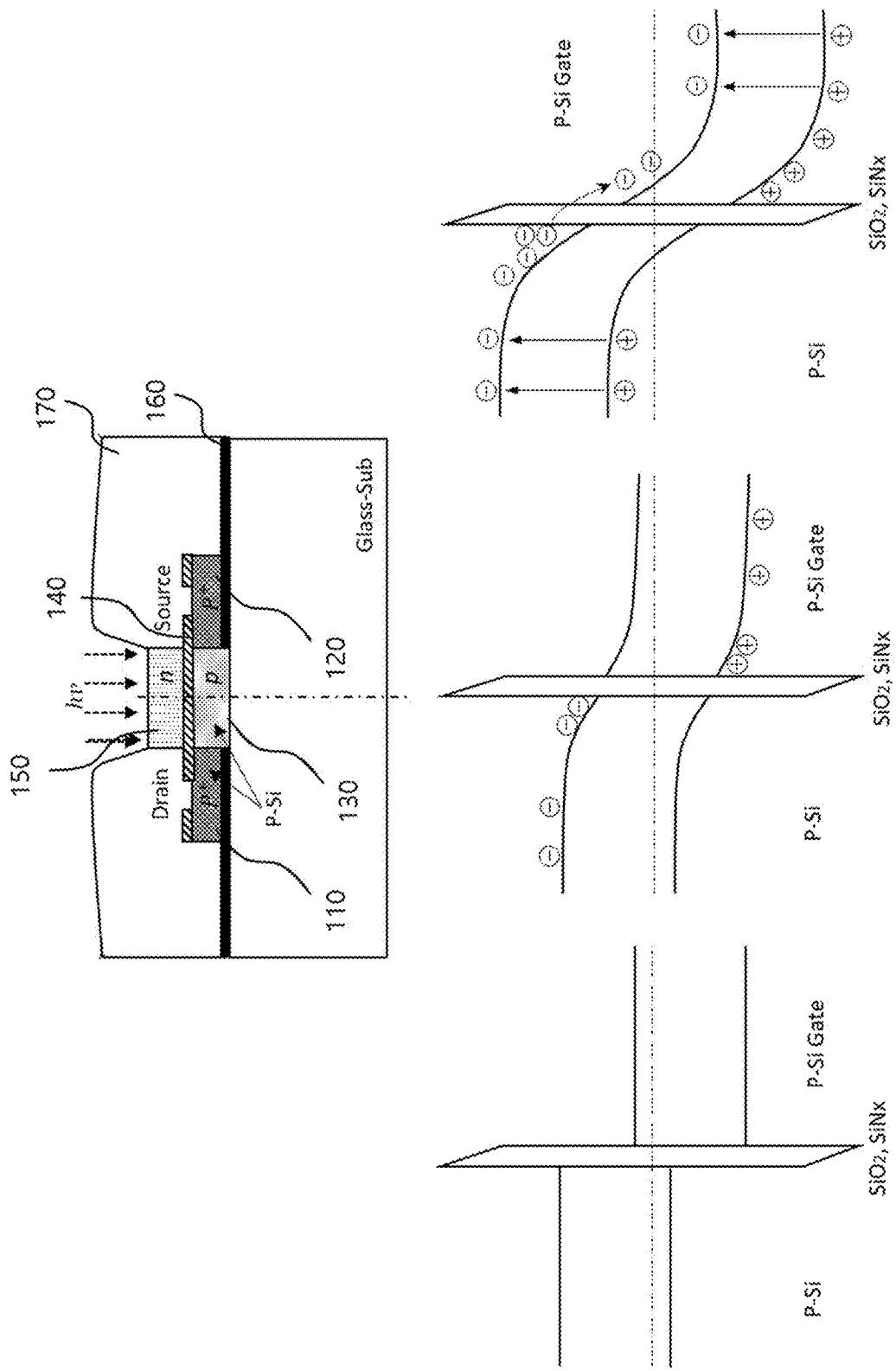
FIG. 7 is an energy band diagram illustrating a tunneling mechanism of a TFT photodetector according to an embodiment of the disclosure.

FIG. 7 is an energy band diagram referred to for describing a tunneling mechanism of a TFT photodetector according to an embodiment of the disclosure.

In the TFT photodetector 100, the shielding layer 170 is formed such that only the gate 150 serving as the light receiver and the active layer 130 facing the gate 150 with the insulating oxide film 140 in between are affected by light, with no effect of light on the remaining area. The shielding layer 170 may be formed by a silicide and metal process, and may not be formed on the gate 150 through a mask.

Light of multiple wavelengths incident on the TFT photodetector 100 is mostly transmitted through or absorbed to the gate 150 formed of poly-Si or a-Si.

If the thickness of the gate 150 is equal to or larger than a predetermined value, for example, 300 nm, short-wavelength light of the blue family in light incident on the TFT photodetector 100 is mostly absorbed to the gate 150, while only very partial short-wavelength light reaches the active layer 130 under the gate 150.

As described above, since the TFT photodetector 100 has an excellent high-sensitivity detection capability compared to a conventional photodetector, even though only a very small part of light of a short wavelength incident on the gate 150 is transmitted through the gate 150 and reaches the active layer 130, the threshold voltage of the current channel is accordingly changed and thus even a slight change in light may be sensed.

Light of the other wavelengths is also transmitted through the gate 150 and reaches the active layer 130 in the same principle. Accordingly, the same phenomenon as observed from reception of light of a short wavelength occurs to the gate 150, thereby causing a change in the threshold voltage of the current channel. However, because light of a relatively long wavelength is easily transmitted through the gate 150 and reaches the active layer 130, compared to light of a short wavelength, the light of a long wavelength generates more EHPs in the active layer 130. Therefore, more electrons migrate to the gate 150 through the insulating oxide film 140 by tunneling, causing a change in the threshold voltage of the current channel between the source 120 and the drain 110.

The metal protection layer 160 formed between the transparent substrate 342 and the active layer 130 blocks light introduced through the transparent substrate 342 from reaching an area other than the active layer 130. Therefore, the light is absorbed only to or transmitted only through the active layer 130 adjacent to the gate 150, leading to efficient tunneling through the insulating oxide film 140.

For more efficient tunneling, a predetermined voltage may be applied between the gate 150 of poly-Si and the active layer 130 of poly-Si, or a property such as dark current may be adjusted by adjusting a tunneling probability and controlling an initial threshold voltage of the TFT photodetector 100.

Then, when the intensity of light is decreased or light is blocked, tunneled electrons are re-tunneled to the active layer 130, and thus the amount of charge in the gate 150 returns to an original level. Accordingly, the formed depletion layer is reduced and, at the same time, photocurrent generated in the current channel is also reduced.

However, it may occur that charges have not completely disappeared and thus have remained in the active layer 130 even after the light blocking, causing an error such as a signal delay in the next light irradiation. To avert this problem, the thickness of the active layer 130 may be controlled such that an area remaining as a neutral area, in which no channel is generated, may be reduced, or a reset device may be added to remove the charges remaining in the active layer 130.

Figure 8:
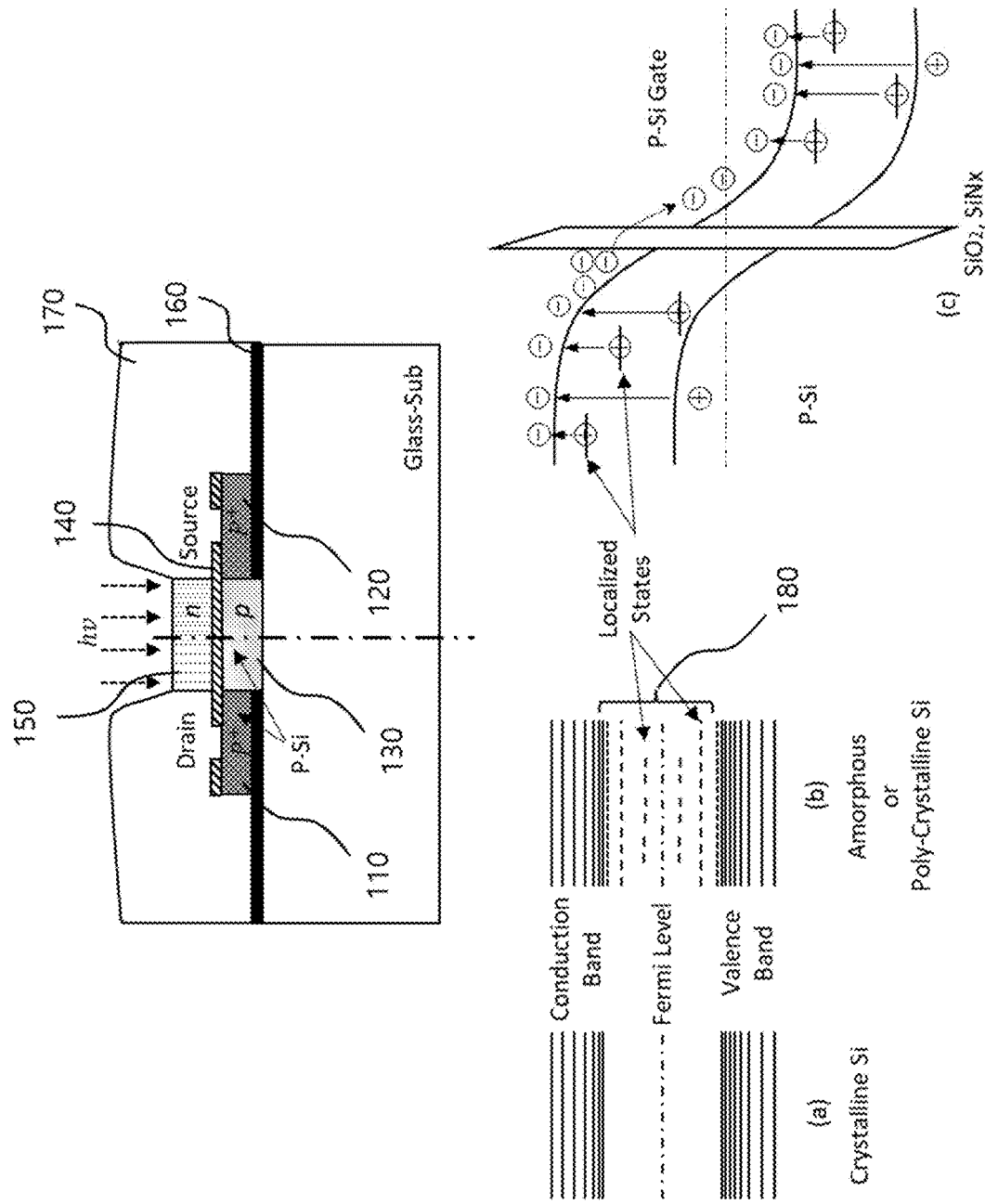
FIG. 8 is a diagram illustrating a photo-electric conversion mechanism caused by a plurality of localized states in a TFT photodetector formed of amorphous silicon (a-Si) or polycrystalline silicon (poly-Si or P—Si)

FIG. 8 illustrates a mechanism for photoelectric conversion caused by a plurality of localized states in a TFT photodetector formed of a-Si or poly-Si.

Panel (a) of FIG. 8 illustrates the energy band of general single crystalline silicon, and panel (b) of FIG. 8 illustrates the energy bands of the gate and the active layer of a TFT photodetector of a-Si or poly-Si.

In the TFT photodetector 100, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiver causes a change in the conductance of the current channel, and thus photocurrent corresponding to the changed conductance flows.

As the gate 150 as the light receiver and the active layer 130 are formed of a-Si or poly-Si, instead of single crystalline silicon, according to an embodiment of the disclosure, a plurality of localized energy levels are formed in the gate 150 and the active layer 130, thereby forming a wavelength extension layer 180 that extends the wavelength range of light absorbed by the TFT photodetector 100.

The wavelength extension layer 180 is formed of a-Si or poly-Si. As illustrated in panel (b) of FIG. 8, a plurality of local energy levels are generated through multiple localized states formed in a forbidden band between the conduction band and valence band of the gate 150 and the active layer 130. The localized states are naturally generated in the forbidden band in view of the nature of the a-Si/poly-Si structure, which obviates the need for applying stress or implanting ion to artificially form the localized states. Therefore, processes are simplified.

Accordingly, the TFT photodetector 100 may generate EHPs by absorbing light even at an energy level lower than 1.12 eV which is the band gap energy of the general single crystalline silicon, thereby enabling detection of the wavelength range of the near-infrared area, which is longer than a maximum detectable wavelength of silicon, 1150 nm, and detection of light in a wavelength that a general silicon photodiode is not capable of detecting.

As described above, because the TFT photodetector 100 is formed of a-Si or poly-Si, compared to a conventional photodetector formed of single crystalline silicon, the wavelength extension layer 180 including multiple localized states in the forbidden band exists, and there is no need for artificially forming localized states by applying uniaxial tensile stress on single crystalline silicon, combining hetero elements (e.g., Ge or the like), implanting ions (e.g., P, B, N, Ga, or the like), or increasing the doping density of an oxide film, poly-Si, and/or a substrate to control a thermal process strength. Therefore, a fabrication process is simplified.

As described before, the TFT photodetector 100 according to the embodiment of the disclosure may generate a flow of photocurrent with an intensity higher than the conventional photodetector by hundreds of times to a few thousands of times, for the same light intensity.

Further, because the TFT photodetector 100 according to the embodiment of the disclosure includes a plurality of localized states, the wavelength range in which a valid signal is detectable is extended. Thus, the TFT photodetector 100 is applicable to a sensor for biometric recognition, motion recognition, or the like.

While the TFT photodetector 100 has been described as implemented in a similar structure to a P-channel metal-oxide semiconductor (PMOS), this should not be construed as limiting. The TFT photodetector 100 may be implemented in a similar structure to an N-channel metal-oxide semiconductor (NMOS) by exchanging the doping impurities of the gate and the active layer.

Figure 9:
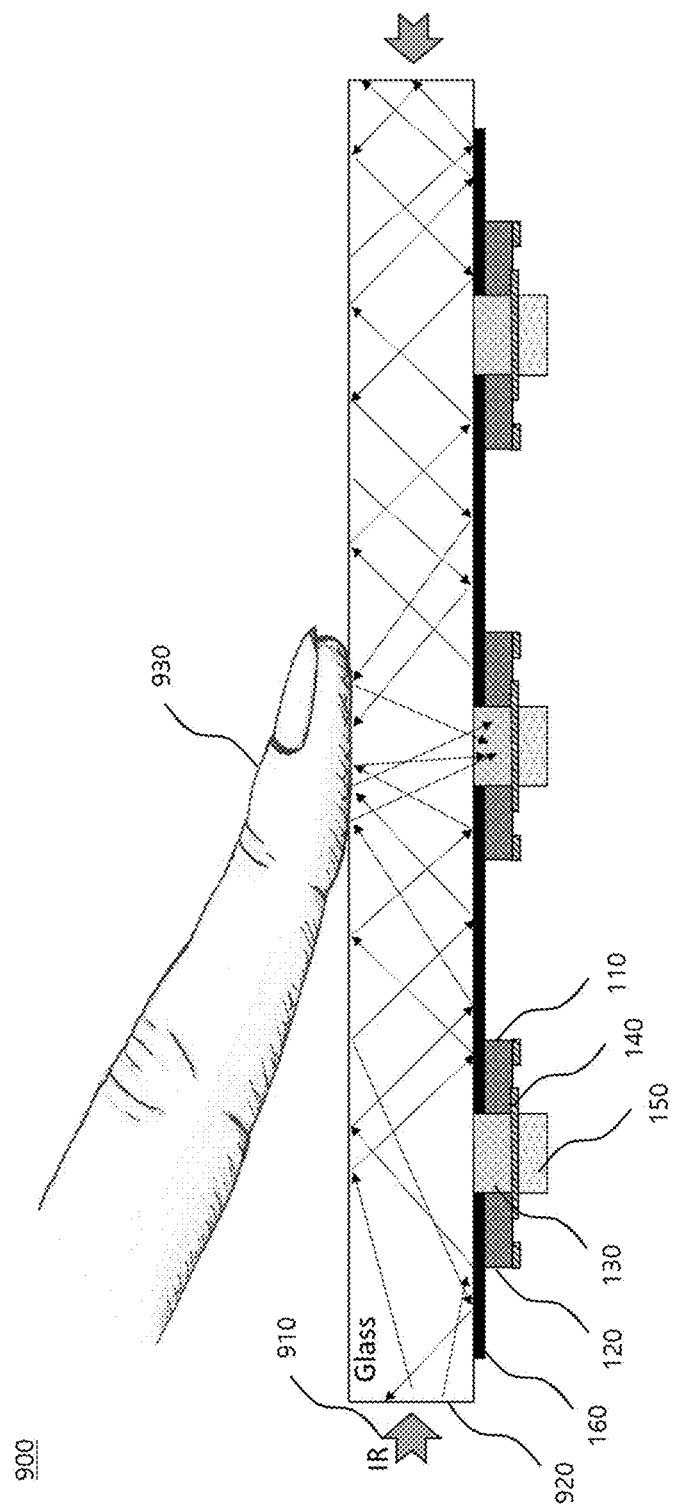
FIG. 9 is a diagram illustrating a display panel for processing biometrics by using infrared (IR) light as a light source.

FIG. 9 is a diagram 900 illustrating a display panel that processes biometrics using an IR light source.

The display panel may include display pixels that emit light and image sensor pixels that collect light. The display panel may further include a processor that processes biometrics along with positioning of a body according to the light collected by the image sensor pixels.

In the present embodiment, the disclosure will be described in detail, centering on image sensor pixels which substantially serve as an image sensor and a transparent material.

The image sensor pixels and the display pixels may be arranged side by side on the same layer or may overlap with each other. Since the image sensor pixels are formed on a transparent material, stacking the image sensor pixels on the display pixels does not make a big visual difference.

An image sensor pixel and a display pixel may be included together in a unit pixel to form one pixel of the display panel. The image sensor pixel may include a TFT photodetector having an active layer formed of a-Si or poly-Si on an amorphous transparent material, and collect light reflected from the body located on the transparent material.

In the case of an IR-based optical touch screen, use of a TFT photodetector-based image sensor very sensitive to IR rays in the manner illustrated in FIG. 9 enables simultaneous recognition of the fingerprint and vein of a finger.

When the finger touches IR light penetrating through glass 920, the IR light reflected from the finger is incident on the cells of TFT photodetectors distributed in a corresponding area, and signals from the cells are acquired as an image based on which the fingerprint may be recognized. Because the vein of the finger may also be acquired at the same time by external light or the reflected IR light, a very high level of security may be guaranteed.

Particularly, the disclosure is characterized in that a unit cell capable of securing an image is distributed in each pixel on a whole surface of the display, so that a fingerprint and a vein may be recognized from the whole surface of the display, instead of a specific position on the display. That is, the problem of additionally disposing a fingerprint recognition sensor and using it overlapped with the display panel may be simply overcome, and the touch screen function may also be used together. Therefore, a display panel which is thinner and cheaper than a conventional display panel may be fabricated.

A TFT photodetector according to an embodiment of the disclosure is formed on the glass 920 being a transparent material, such as an amorphous glass substrate or a flexible substrate.

For better understanding, the disclosure will be described in the context of the amorphous glass 920 as a transparent material.

The TFT photodetector includes, on the glass 920, the gate 150 formed of a-Si or poly-Si, the insulating oxide film 140 capable of controlling tunneling of photo-excited charges, the drain 110, the source 120, and the active layer 130 in which a current channel is to be formed between the source 120 and the drain 110. Although the drain 110, the source 120, the active layer 130, and the gate 150 are formed of a-Si or poly-Si, they may be formed of any other material, as far as the conductive property of the material is controllable by tunneling or an electric field.

An area on which light reflected from the body is incident is confined to the gate 150 serving as the light receiver and the active layer 130 with the insulating oxide film 140 interposed between the active layer 130 and the gate 150. For this purpose, the metal protection layer 160 may be formed on a boundary surface of the transparent substrate 342, except for the area between the transparent substrate 342 and the active layer 130, to shield unnecessary light introduced into the TFT photodetector 100 through the glass 920. The metal shielding layer 170 may be formed in the remaining area except for the gate 150 in the upper part of the TFT photodetector 100. The shielding layer 170 may be formed by a silicide and metal process. The TFT photodetector 100 limits an area on which light is incident to the gate 150 serving as the light receiver by means of the shielding layer 170, thereby maximizing the photoelectric conversion in the gate 150.

When IR light is irradiated from an IR light source 910, the IR light is reflected back from a body 930 and then used for biometrics.

The IR light source 910 may irradiate IR light from one side of the glass 920 being a transparent material to cause diffused reflection in the glass 920.

The image sensor pixels may collect IR light which has been diffusedly reflected from the body contacting the glass 920.

The processor may process biometrics together with positioning of the body 930 from the light which has been generated by the IR light source 910 and then collected.

For example, the processor may identify information about at least one of a vein, a fingerprint, or a face based on the light reflected from the body 930, and process biometrics by comparing the identified information with pre-stored information.

The body 930 is a part from which uniquely identifiable biometric information may be acquired, and may be interpreted as the tip of a finger, a palm, or the like from which a fingerprint may be acquired.

Further, the processor may process biometrics along with positioning of the body according to light reflected from the body 930.

With reference to FIG. 9, the embodiment in which after the IR light source irradiates IR light from one side of a display panel, the IR light is reflected from the body 930 during diffused reflection in the glass 920 and collected by the TFT photodetector, and biometrics is processed based on the reflected light by the processor has been described above.

Figure 10:
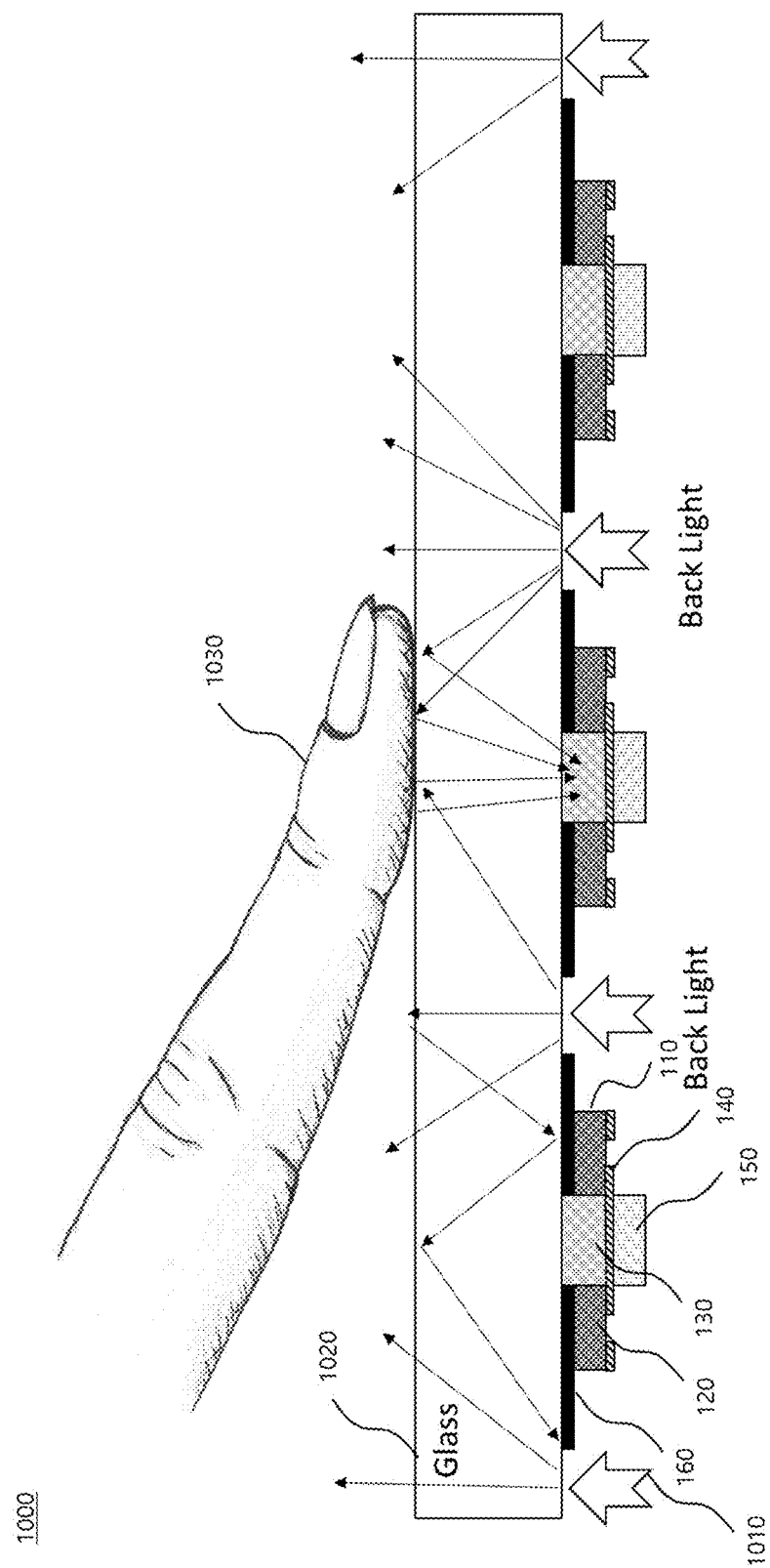
FIG. 10 is a diagram illustrating a display panel for processing biometrics by using a backlight as a light source.

FIG. 10 illustrates an embodiment 1000 of using a backlight light source instead of an IR light source.

In FIG. 10, a display panel that processes biometrics using a backlight as a light source is illustrated.

A backlight light source 1010 may be used as a light source for the TFT photodetector.

The backlight light source 1010 may irradiate backlights in a transmission direction of the transparent material through a space between adjacent TFT photo detectors.

As illustrated in FIG. 10, the metal protection layer 160 for blocking light is formed on a boundary surface of glass 1020 being a transparent material except for an area between the glass 1020 and the active layer 130, to block the introduction of unnecessary light into the TFT photodetector through the glass 920.

Image sensor pixels may collect light which has passed through the glass 920 and then reflected from the body, and the processor may process biometrics together with positioning of the body from the light which has been generated by the backlight light source and then collected. Particularly, the processor may process biometrics together with positioning of the body from light which has been generated by the backlight light source, reflected from the body contacting the transparent material, and then collected.

For example, the processor may identify information about at least one of a vein, a fingerprint, or a face based on the light reflected from the body, and process biometrics by comparing the identified information with pre-stored information, for the display panel.

Use of the backlight light source 1010 as a light source for the TFT photodetector enables simultaneous recognition of the fingerprint and vein of a finger. When the finger touches backlight penetrating through the glass 1020, the backlight reflected from the finger is incident on the cells of TFT photodetectors distributed in a corresponding area, and signals from the cells are acquired as an image based on which the fingerprint may be recognized. Because the vein of the finger may also be acquired at the same time by external light or backlight, a very high level of security may be guaranteed.

Further, the disclosure is characterized in that a unit cell capable of securing an image is distributed in each pixel on a whole surface of the display, so that a fingerprint and a vein may be recognized from the whole surface of the display, instead of a specific position on the display. That is, the problem of additionally disposing a fingerprint recognition sensor and using it overlapped with the display panel may be simply overcome, and the touch screen function may also be used together. Therefore, a display panel which is thinner and cheaper than a conventional display panel may be fabricated.

Figure 11:
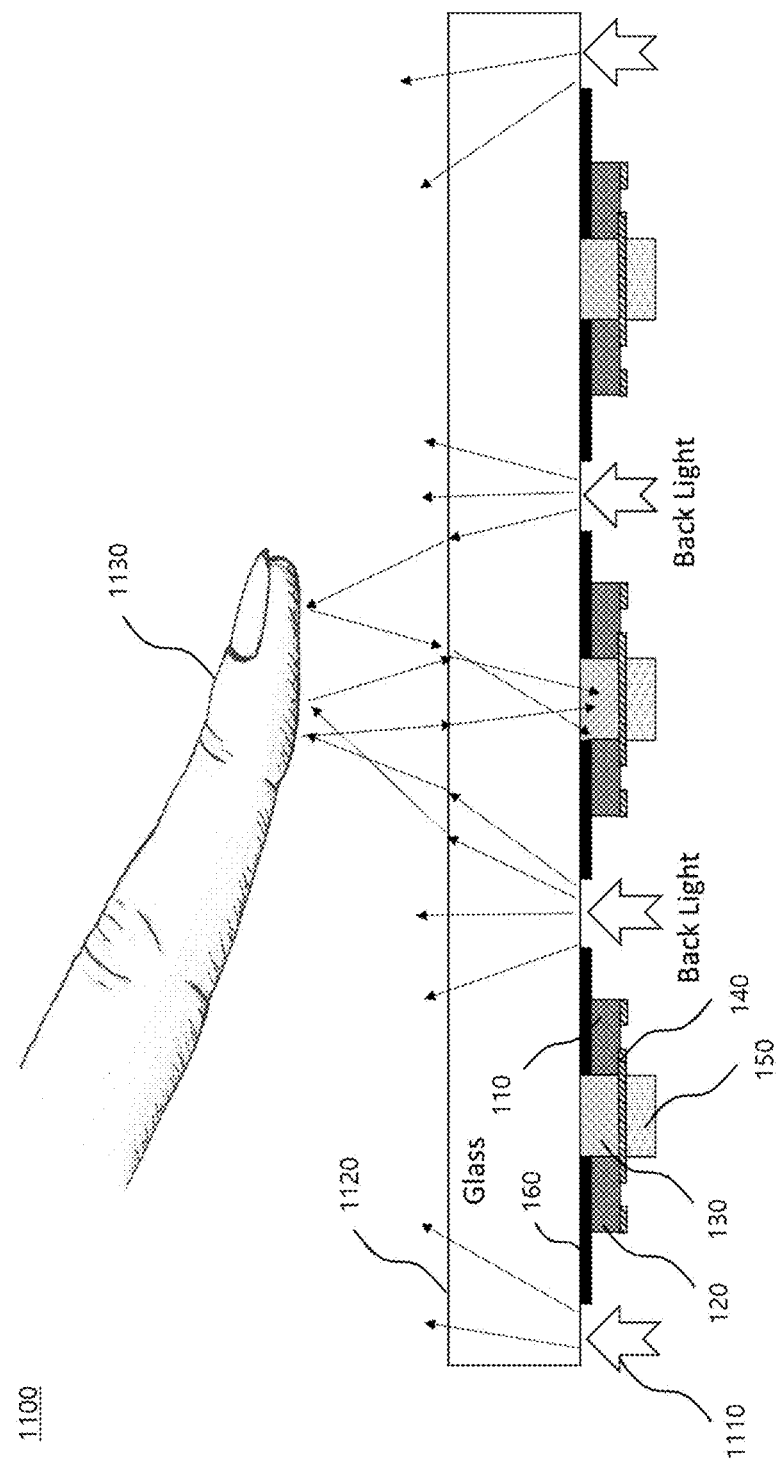
FIG. 11 is a diagram illustrating an embodiment of a display panel for processing biometrics from a body spaced by a predetermined distance, without touch on glass.

FIG. 11 is a diagram illustrating an embodiment 1100 of a display panel that processes biometrics from a body spaced from glass by a predetermined distance, without touching the glass.

One of the problems with a contact fingerprint system is that a recognition rate is significantly low due to contamination of a glass surface. Since the TFT photodetector of the disclosure is capable of easily recognizing direct incident light, even though a finger 1130 is away from the surface of the glass 1120 by a certain distance, a fingerprint may be recognized when light 1110 reflected from or transmitted to the finger 1130 enters cells of the TFT photodetector, as illustrated in FIG. 11. Further, as a motion of an object at a certain distance may also be recognized, the TFT photodetector may also function as a proximity sensor. Thus, multiple functions may be used at the same time in the TFT photodetector.

Biometrics is a technique of recognizing an individual using human physiological or behavioral characteristics.

Biometrics includes fingerprint recognition, iris recognition, finger vein, signature recognition, and facial recognition. Beyond simple light emission, the display panel according to the disclosure boasts of high recognition performance, user convenience and comfort, and fast recognition in recognizing the vein of a finger, a hand wrist, the back of a hand, or the like by TFT photodetectors integrated with display pixels.

Each individual has a different vein pattern for a finger or hand wrist. Even the same person has a different vein pattern for each finger, which may ensure high reliability in personal authentication. In a general vein recognition device, a camera may receive light from an LED. The resulting difficulty in maintaining a darkroom effect causes diffused reflection. To obtain an accurate recognition result without being affected by ambient light and a distance from an object, a recognition target part such as the back of a hand, a palm, or a finger should artificially and accurately be brought into contact with a specific area of the camera or a scanner and then captured by the camera or the scanner.

However, the display panel according to the disclosure may overcome the conventional problems by using the TFT photo detectors integrated with the display pixels.

Figure 12:
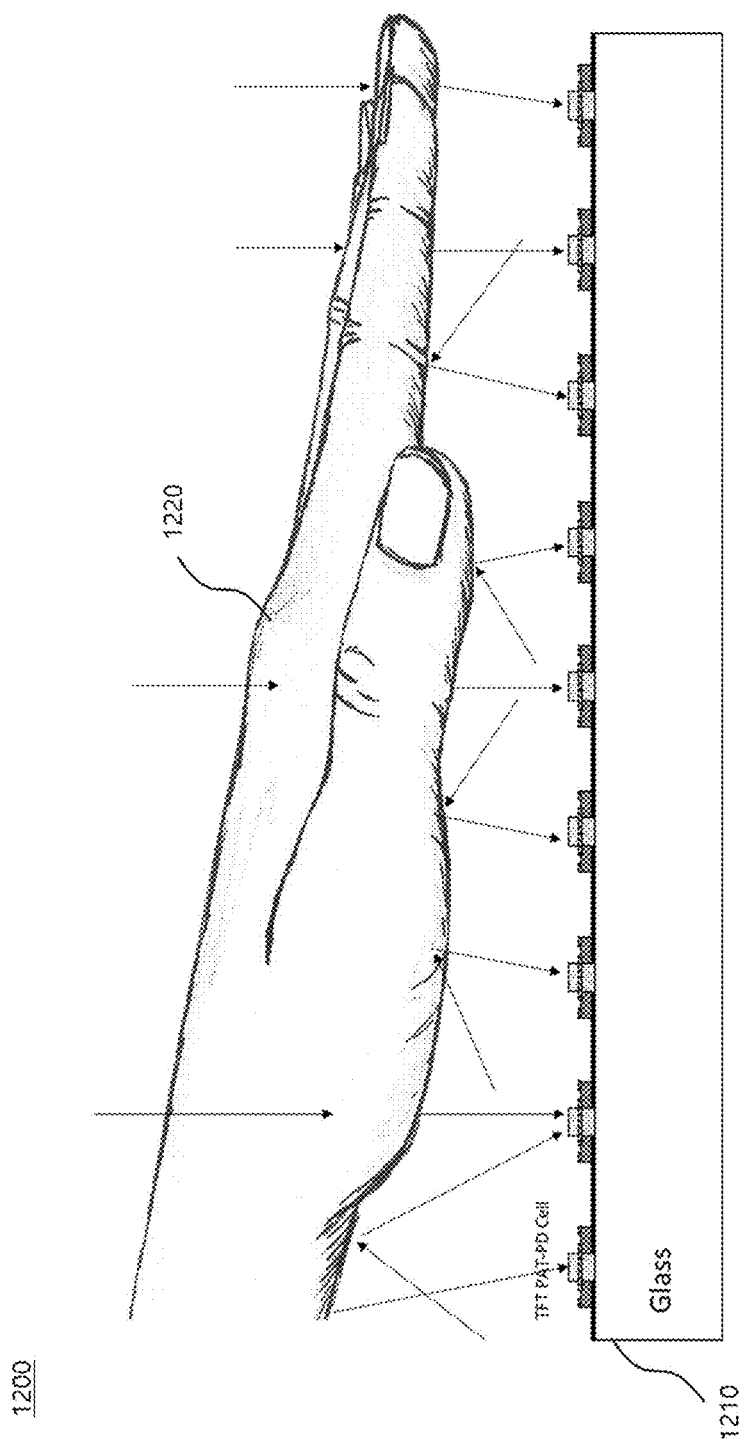
FIG. 12 is a diagram illustrating another embodiment of a display panel for processing biometrics from a body spaced by a predetermined distance, without touch on glass.

FIG. 12 illustrates another embodiment 1200 of a display panel that processes biometrics from a body spaced from glass by a predetermined distance without touching the glass.

When a very high-level authentication system is to be implemented on the display, the lines or vein of a hand 1220 may be recognized using external light as in the embodiment 1200 of FIG. 12. As illustrated in FIG. 12, a very high level of authentication system may be secured with a screen panel 1210 serving as both of a display and an image sensor by means of TFT photodetectors capable of recognizing an object in a non-contact manner.

In addition, a monitor located in a living room may detect an abnormal situation occurring in the living room, for example, a fire, and a quick measure may be taken accordingly.

Figure 13:
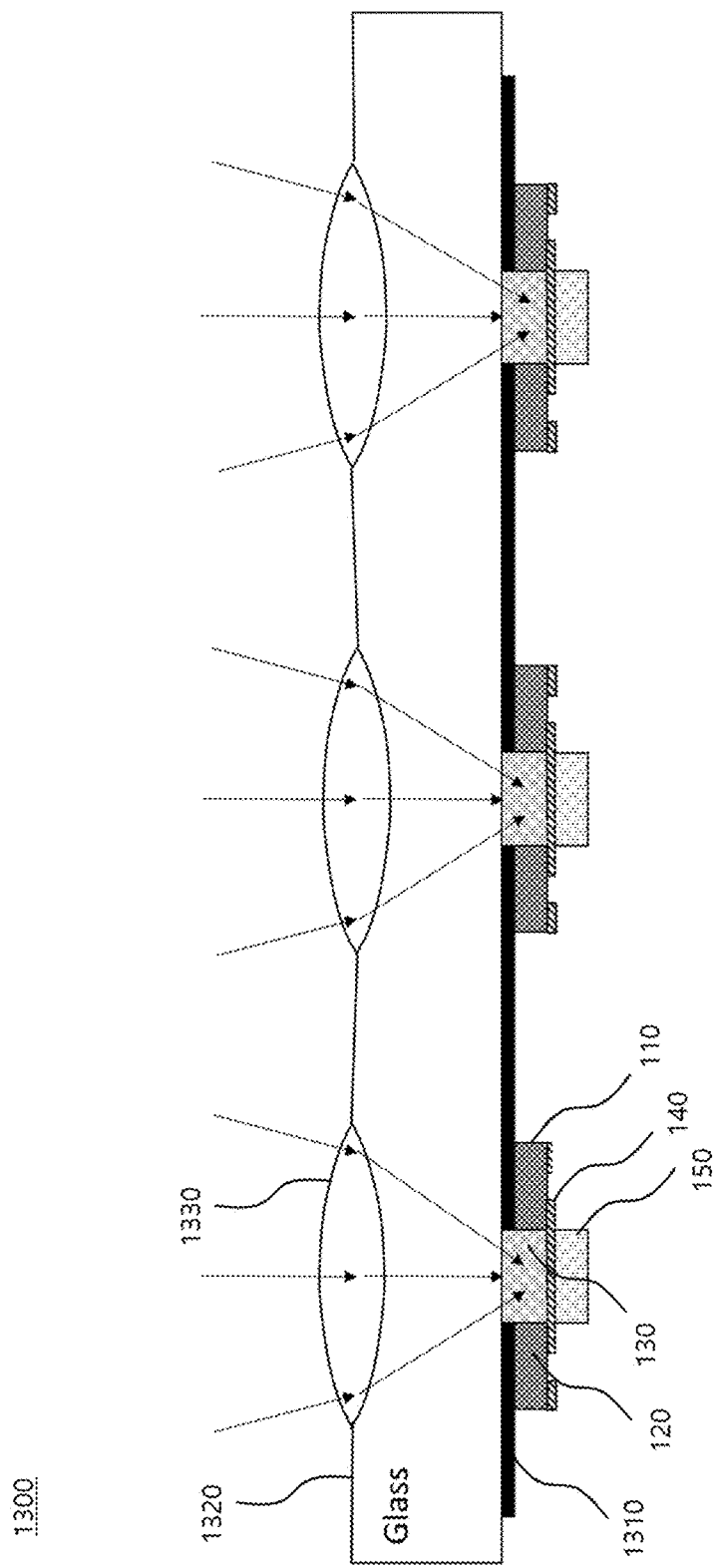
FIG. 13 is a diagram illustrating an embodiment of a display panel for increasing light collection efficiency by treating a glass surface.

FIG. 13 is a diagram illustrating an embodiment 1300 of a display panel in which the surface of glass is treated to increase light collection efficiency.

Because TFT photodetectors included in the display panel according to the disclosure do not include microlenses and objective lenses, there is a certain distance limit in accurately recognizing an object. For example, it is difficult to accurately focus on the shape of an object apart from the display panel by 20 to 30 cm or more.

As illustrated in FIG. 13, when the surface of glass 1320 of the display panel is processed, the same effect as that of the microlens which is a part of an image sensor manufacturing process may be obtained. Thus, a larger amount of light may be absorbed and an object recognition distance is longer.

For example, the surface of the glass 1320 of the display panel may be formed in a structure capable of diffusing or condensing light by refracting light, such as a concave lens pattern or a convex lens pattern. In FIG. 13, the surface of the glass 1320 of the display panel may be processed in the form of a convex lens 1330.

In addition, when the glass 1320, which serves as an objective lens, is adhered, a long-distance object may also be accurately recognized without a distance limit.

As a result, according to the disclosure, a highly sensitive image sensor may be implemented on a glass substrate or a flexible substrate such as a PI film, used as a display panel by the TFT fabrication technology.

Further, the display module may function as an image sensor without having a separate image sensor on the display panel, and biometrics may be processed by collecting information such as a fingerprint or a vein into the image sensor.

Besides, since a light emitting device or a BLU of the display is used as a light source for an image sensor, image sensing may be processed without using a separate light emitter required for the image sensor according to the disclosure.

As is apparent from the foregoing description of various embodiments of the disclosure, a high-sensitivity image sensor may be implemented on a glass substrate or a flexible substrate such as a polyimide film, which is used as a display panel, by a TFT fabrication technology.

According to an embodiment of the disclosure, biometrics may be processed fast and accurately using a display panel having display pixels and image sensor pixels integrated thereon.

According to an embodiment of the disclosure, a display module may function as an image sensor without the need for a separate image sensor on the display panel.

According to an embodiment of the disclosure, an image sensing process may be performed without the need for separately providing a light emitter for an image sensor, by using a light emitting device or BLU of a display as a light source for the image sensor.

According to an embodiment of the disclosure, a transparent display panel capable of displaying and image sensing may be implemented by vertically stacking a screen panel of a display and an image sensing panel or arranging the screen panel and the image sensing panel on the same panel.

According to an embodiment of the disclosure, the problem of separately disposing a fingerprint recognition sensor and using the fingerprint recognition sensor overlapped with a display panel may easily solved, and a touch screen function may also be used. A thinner and cheaper than a conventional display panel may be fabricated.

According to an embodiment of the disclosure, a switching TFT for display and a driving TFT for image sensing may be fabricated in a single process by arranging a screen panel and an image sensing panel on the same panel.

According to an embodiment of the disclosure, a light source for a display may also be used as a light source for an image sensor.

According to an embodiment of the disclosure, both of a BLU of an LCD and a light emitting source of an OLED may be used.

According to an embodiment of the disclosure, it is possible to detect light in the wavelength band of a near-IR area longer than a maximum detectable wavelength, 1150 nms in general silicon.

The above description is merely illustrative of the technical idea of the disclosure, and those skilled in the art may make various modifications and changes without departing from the essential features of the disclosure. In addition, the embodiments disclosed herein are intended to describe the disclosure, not limiting the technical spirit of the disclosure, and the scope of the technical idea of the disclosure is not limited by these embodiments. Therefore, the protection scope of the disclosure should be interpreted by the appended claims, and all technical ideas within their equivalency should be construed as being embraced in the scope of the disclosure.

What is claimed is:

1. A display panel comprising:
    a display pixel configured to irradiate light;
    a glass formed of amorphous transparent material;
    an image sensor pixel included together with the display pixel in one unit pixel, including a thin film transistor (TFT) photodetector including an active layer formed of amorphous silicon or polycrystalline silicon on the glass, and configured to collect light reflected from a body located on the glass;
    an infrared (IR) light source configured to cause diffused reflection on the glass by irradiating IR light through a side surface of the glass; and
    a processor configured to process biometrics along with positioning of the body according to the light reflected from the body,
    wherein the image sensor pixel collects the IR light diffusedly reflected from the body contacting the glass, and the processor processes the biometrics along with the positioning of the body by the light generated from the IR light source and then collected.

2. The display panel according to claim 1, further comprising a backlight light source configured to irradiate backlight in a transmission direction of the transparent material through a space between adjacent TFT photodetectors,
    wherein the image sensor pixel collects the backlight passed through the transparent material and then reflected back from the body, and the processor processes the biometrics along with the positioning of the body by the light generated from the backlight light source and then collected.

3. The display panel according to claim 2, wherein the processor processes the biometrics along with the positioning of the body by light generated from the backlight light source and then reflected from the body contacting the transparent material.

4. The display panel according to claim 2, wherein the processor processes the biometrics along with the positioning of the body by light generated from the backlight light source and then reflected from the body which does not contact the transparent material.

5. The display panel according to claim 1, wherein the processor processes the biometrics by identifying information about at least one of a vein, a fingerprint, or a face based on the light reflected from the body and comparing the identified information with pre-stored information.

6. The display panel according to claim 1, wherein the transparent material is formed into a concave lens pattern or a convex lens pattern at a position of the unit pixel.

7. The display panel according to claim 1, wherein the unit pixel comprises:
    the TFT photodetector including the active layer formed of amorphous silicon or polycrystalline silicon on an amorphous transparent substrate; and
    at least one transistor electrically coupled to the TFT photodetector and configured to generate a voltage output from photocurrent generated in the active layer.

8. The display panel according to claim 1, wherein the TFT photodetector is formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

9. The display panel according to claim 7, wherein the active layer includes a material having a conductive property controllable by tunneling or an electric field.

10. The display panel according to claim 9, wherein the active layer includes at least one of amorphous silicon or polycrystalline silicon.

11. The display panel according to claim 1, wherein the TFT photodetector comprises:
   an amorphous transparent substrate including the transparent material;
   a source formed of amorphous silicon or polycrystalline silicon on the transparent substrate;
   a drain formed of amorphous silicon or polycrystalline silicon, opposite to the source on the transparent substrate;
   the active layer formed between the source and the drain and including a current channel formed between the source and the drain;
   an insulating oxide film formed on the source, the drain, and the active layer; and
   a light receiver formed on the insulating oxide film, configured to absorb light, and insulated from the active layer by the insulating oxide film.

12. The display panel according to claim 11, wherein in the TFT photodetector, when light is incident on the light receiver, electrons migrate by tunneling through the insulating oxide film between the light receiver and the active layer excited with the insulating oxide film in between, the electron migration changes an amount of charge in the light receiver, the changed amount of charge changes a threshold voltage of the current channel, and thus photocurrent flows in the current channel.

13. The display panel according to claim 1, wherein the TFT photodetector uses light generated from the display panel as a light source for the image sensor pixel.

14. A display panel comprising:
   a display pixel configured to irradiate light;
   a glass formed of amorphous transparent material;
   an image sensor pixel stacked with the display pixel, included together with the display pixel in one unit pixel, including a thin film transistor (TFT) photodetector including an active layer formed of amorphous silicon or polycrystalline silicon on the glass, and configured to collect light reflected from a body located on the glass; and
   an infrared (IR) light source configured to cause diffused reflection on the glass by irradiating IR light through a side surface of the glass;
   a processor configured to process biometrics along with positioning of the body according to the light reflected from the body,
   wherein the image sensor pixel collects the IR light diffusedly reflected from the body contacting the glass, and the processor processes the biometrics along with the positioning of the body by the light generated from the IR light source and then collected.

15. The display panel according to claim 14, wherein the image sensor cell is formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

16. A display panel comprising:
   a display pixel configured to irradiate light;
   a glass formed of amorphous transparent material;
   an image sensor pixel formed together with the display pixel on the same layer, included together with the display pixel in one unit pixel, including a thin film transistor (TFT) photodetector including an active layer formed of amorphous silicon or polycrystalline silicon on the glass, and configured to collect light reflected from a body located on the glass;
   an infrared (IR) light source configured to cause diffused reflection on the glass by irradiating IR light through a side surface of the glass; and
   a processor configured to process biometrics along with positioning of the body according to the light reflected from the body,
   wherein the image sensor cell is formed in a structure in which when light is incident, electrons migrate into an N-type gate by tunneling from a P-type active layer to an oxide film, among charges of two PN areas excited with the oxide film in between, the electron migration changes a threshold voltage of a current channel between a source and a drain in correspondence with a change in a total amount of charge in the gate, photocurrent proportional to the intensity of the incident light flows in the active layer, and a voltage output is generated from the flowing photocurrent.

* * * * *